(12) United States Patent
Toshima et al.

(10) Patent No.: US 7,410,543 B2
(45) Date of Patent: *Aug. 12, 2008

(54) SUBSTRATE PROCESSING METHOD

(75) Inventors: Takayuki Toshima, Nirasaki (JP);
Naoki Shindo, Nirasaki (JP); Tadashi Iino, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/957,003

(22) Filed: Oct. 1, 2004

(65) Prior Publication Data

US 2005/0051246 A1 Mar. 10, 2005

Related U.S. Application Data

(62) Division of application No. 09/971,136, filed on Oct. 3, 2001, now Pat. No. 6,817,368.

(30) Foreign Application Priority Data

| Oct. 4, 2000 | (JP) | ............................ 2000-304375 |
| Feb. 19, 2001 | (JP) | ............................ 2001-041482 |

(51) Int. Cl.
*B08B 3/00* (2006.01)
*B08B 5/00* (2006.01)

(52) U.S. Cl. .............................. 134/2; 134/18; 134/19; 134/21; 134/25.1; 134/25.4; 134/30; 134/31; 134/36; 134/37; 134/902

(58) Field of Classification Search ...................... 134/2, 134/18, 19, 21, 25.1, 25.4, 30, 31, 36, 37, 134/902

See application file for complete search history.

(56) References Cited

U.S. PATENT DOCUMENTS

| 4,749,440 A | 6/1988 | Blackwood et al. |
| 4,778,532 A | 10/1988 | McConnell et al. |
| 4,812,201 A | 3/1989 | Sakai et al. |
| 5,248,380 A | 9/1993 | Tanaka et al. |
| 5,288,333 A | 2/1994 | Takana et al. |
| 5,370,846 A | 12/1994 | Yokomi et al. |
| 5,503,708 A | 4/1996 | Koizumi et al. |
| 5,571,367 A | 11/1996 | Nakajima et al. |
| 5,845,660 A | 12/1998 | Shindo et al. |
| 5,986,875 A | 11/1999 | Donde et al. |
| 6,109,278 A | 8/2000 | Shindo et al. |
| 6,178,973 B1 | 1/2001 | Franca et al. |
| 6,235,112 B1 | 5/2001 | Satoh et al. |
| 6,319,329 B1 | 11/2001 | Kamikawa et al. |
| 6,491,763 B2 | 12/2002 | Verhaverbeke et al. |
| 6,551,409 B1 | 4/2003 | DeGendt et al. |
| 6,588,437 B1 | 7/2003 | Higashi |
| 6,613,692 B1 * | 9/2003 | Toshima et al. ............. 438/745 |
| 6,817,370 B2 * | 11/2004 | Bergman et al. ............ 134/105 |

\* cited by examiner

*Primary Examiner*—Zeinab E EL-Arini
(74) *Attorney, Agent, or Firm*—Morrison & Foerster LLP

(57) ABSTRACT

Resists can be removed while metal contamination of wafers, etc. and generation of particles, and growth of oxide films are suppressed. A substrate processing method comprises feeding a processing gas, such as ozone gas, into a processing vessel to pressurize an atmosphere surrounding a substrate. A solvent gas, such as steam, is fed into the processing vessel while the processing gas is fed into the processing vessel, whereby a resist of the substrate can be removed with the solvent gas and the processing gas while metal corrosion, etc. can be prevented.

6 Claims, 10 Drawing Sheets

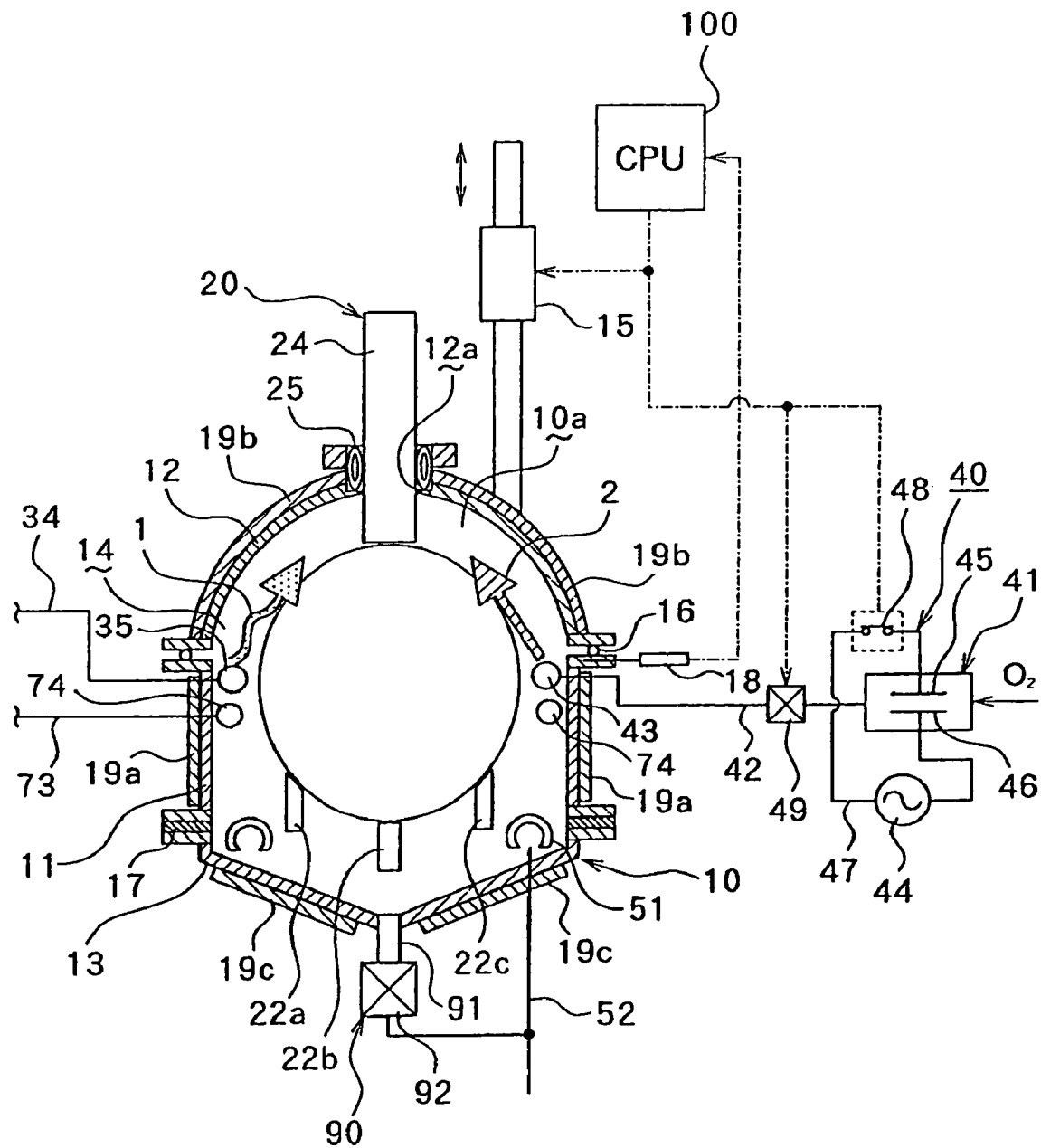
F I G. 3

SUBSTRATE PROCESSING METHOD

CROSS-REFERENCE TO RELATED APPLICATIONS

This application is a division of application Ser. No. 09/971,136 filed on Oct. 3, 2001, now U.S. Pat. No. 6,817,368 and is related to subject matter disclosed in Japanese Patent Application No. 2000-304375 filed on Oct. 4, 2000 in Japan and Japanese Patent Application No. 2001-41482 filed on Feb. 19, 2001 to which this application claims priority under Paris Convention, and which all three are specifically incorporated herein by reference.

BACKGROUND OF THE INVENTION

1. Field of the Invention

The present invention relates to a substrate processing method and a substrate processing apparatus, more specifically, a substrate processing method and a substrate processing apparatus for processing substrate-to-be-processed, such as semiconductor wafers, LCD glass substrates or others, held in an atmosphere sealed processing vessel with a processing gas, such as ozone, etc., fed into the processing vessel.

2. Related Background Art

Generally in fabricating a semiconductor device, a series of processing steps of applying a photoresist to a semiconductor wafer, an LCD substrate or others (hereinafter called a wafer or others) as a substrate-to-be-processed, the step of diminishing a circuit pattern by photolithography, transferring the circuit pattern to a photoresist and developing the circuit pattern, and the step of removing the photoresist from the wafer or others is conducted.

One example of the above-described processing will be explained with reference to FIGS. 1A to 1H by means of a case where a substrate-to-be-processed is a silicon wafer. First, a thick oxide film OX1 is formed on the surface of a silicon wafer W (hereinafter called a wafer W) (the first oxide film forming step: see FIG. 1A). Then, a resist is applied to the surface of the oxide film OX1 to from a resist pattern RP1 (the first resist pattern forming step: see FIG. 1B). Next, an unnecessary portion of the oxide film is etched off with a chemical liquid, such as DHF (HF/H$_2$O) or BHF (the first etching step: see FIG. 1C). Then, the resist, which is unnecessary, is released with a chemical liquid (sulfonated water), a mixed liquid of SPM (H$_2$SO$_4$/HEO$_2$) (the first resist removing step: see FIG. 1D). Next, a thin oxide film OX2 is formed on the surface of the wafer W from which the unnecessary resist has been removed (the second oxide film forming step: see FIG. 1E). A resist is again applied to the surface of the oxide film OX2, and a resist pattern RP2 is formed (the second resist pattern forming step: see FIG. 1F). An unnecessary portion of the oxide film is etched off with a chemical liquid, such as DHF (HF/HEO), BHF or others (the second etching step: see FIG. 1G). Finally, the resist, which is unnecessary, is released (the second resist removing step: see FIG. 1H).

In a conventional cleaning equipment used as the above-described resist removing means, generally wafers, etc. are immersed in cleaning tank filled with a chemical liquid, such as SPM (a mixed liquid of H$_2$SO$_4$/H$_2$O$_2$) (sulfonated water) or others to remove the resist films.

However, when sulfonated water is used as the chemical liquid in the first resist removing step (see FIG. 1D), sulfuric acid ions remain on the surface of the wafer W after the resist has been removed, and there is a risk that the residual sulfuric acid ions may become a cause for particles and cause contamination. Furthermore, the residual sulfuric acid ions also causes an uneven thickness and poor film quality of the thin oxide film formed in the following second oxide film forming step (see FIG. 1E).

On the other hand, recently, it is required ecologically to removed the resist with a solution of ozone (O$_3$), whose waste fluid is easy to treat. In this case, the so-called dip cleaning, in which the wafers or wafers or others are immersed in a cleaning tank filled with a solution of ozone, is used, so that the resist is oxidized with oxygen radicals in the solution to be decomposed into carbon dioxide, water, etc.

The above-described solution is generally prepared by bubbling and dissolving a high concentration of ozone gas into pure water, and later the thus prepared solution is filled in a cleaning tank. It is often that meanwhile ozone in the solution is decomposed, and the solution has the ozone concentration decreased, and a sufficient amount of ozone cannot be supplied to the resist surface. High reaction rates cannot be provided.

Then, in place of the dip cleaning, in which the wafers or others are immersed in a solution of ozone, it is proposed to use a processing gas, e.g., ozone, and a vapor, e.g., steam, as a solvent to remove the resist from the wafers or others. In this cleaning method, a processing gas, e.g., ozone gas is fed to the wafers or others held in a tightly closed processing vessel to thereby remove the resist from the wafers or others. The use of ozone and steam is free from the residual sulfuric acid ions, and accordingly can improve thickness evenness film quality of the thin film. In this case, ozone is generated by ozone generating means which mixes oxygen (O$_2$), a base gas as a raw material with nitrogen (N$_2$) while being discharged.

However, this ozone gas contains nitrogen as described above. As the ozone gas is fed, the nitrogen also flows into the processing vessel to contact the wafers or others. When nitrogen contacts the wafers or others, the nitrogen reacts with the ozone gas to corrode and etch metals of aluminum (Al) and tungsten (W) of the wiring portions, causing particles. This problem of the metal contamination and particle generation is the case also with the wafers or others which have not been subjected to the wiring step.

The processing with ozone gas containing nitrogen excessively oxidizes the wafers or others with NO$_x$- or HNO$_x$-based atmospheres (chemicals), and chemical oxide films grow on the surfaces of the wafers or others, possibly causing thickness unevenness and poor film quality of the thin oxide film.

SUMMARY OF THE INVENTION

The present invention was made in view of the above-described problems, and an object of the present invention is to provide a substrate processing method and a substrate processing apparatus which can facilitate the removal of resists while suppressing the metal contamination of wafers or others and the generation of particles, and suppressing the growth of chemical oxide films on the surfaces of the wafers or others.

To achieve the above-described object, the substrate processing method according to the present invention for processing at least a substrate-to-be-processed held in a processing vessel with a processing gas fed to the substrate-to-be-processed comprises the step of feeding the processing gas into the processing vessel to pressurize the atmosphere surrounding the substrate-to-be-processed; and the step of feeding solvent vapor into the processing vessel while feeding the processing gas. In the present invention, the processing gas can be, e.g., ozone gas, chlorine gas, fluorine gas, and chlorine gas, fluorine gas, hydrogen gas, etc. pre-containing various radicals.

The substrate processing apparatus according to the present invention for processing at least a substrate-to-be-processed held in a processing vessel with a process gas fed to the substrate-to-be-processed comprises a processing gas feed system for feeding the processing gas into the processing vessel; a solvent vapor feed system for feeding solvent vapor into the processing vessel; a central controller for controlling the feed of the processing gas and the solvent vapor to be fed into the processing vessel; a nitrogen feed pipe for feeding nitrogen gas into the processing vessel; and a nitrogen gas flow rate controller for controlling a nitrogen gas flow rate through the nitrogen gas feed pipe.

A substrate processing apparatus for processing at least a substrate-to-be-processed held in a processing vessel with ozone gas fed to the substrate-to-be-processed comprises an ozone generator for generating ozone gas; an ozone gas feed pipe interconnecting the ozone gas generator and the processing vessel; and a steam feed pipe for feeding steam into the processing vessel, the ozone gas generator being connected to a nitrogen gas feed pipe with a nitrogen gas flow rate control valve inserted in and to an oxygen feed pipe for feeding oxygen.

In the substrate processing method and the substrate processing apparatus according to the present invention, before a processing gas is fed to the processing vessel to process the substrate-to-be-processed, the processing gas is fed into the processing vessel to pressurize the atmosphere surrounding the substrates, whereby the atmosphere in the processing vessel is replaced by an atmosphere of the processing gas while the interior of the processing vessel is pre-pressurized. Accordingly, the risk that the substrate-to-be-processed may contact gases, etc. other than the processing gas is avoided, and metal contamination and generation of particles can be accordingly prevented. Rates of the reaction between solvent vapor and the processing gas fed subsequently into the processing vessel are increased to thereby improve efficiency of the processing.

Furthermore, a feed rate of nitrogen gas is controlled to control etching rates of metals suitably to process substrate-to-be-processed which are not subjected to wiring steps. Furthermore, a feed rate of nitrogen gas is controlled to control growth of an oxide film formed on the surfaces of substrate-to-be-processed.

BRIEF DESCRIPTION OF THE DRAWINGS

FIG. 3 is a sectional view of a major part of the substrate processing apparatus according to the first embodiment in a state where steam and ozone gas are fed to wafers in the processing vessel.

DESCRIPTION OF THE PREFERRED EMBODIMENTS

The invention according to a first embodiment of the present invention will be explained with reference to the drawings attached hereto. In the present embodiment, a resist is removed from a semiconductor wafer W (hereinafter called a wafer W) by using ozone gas.

Figure 2:
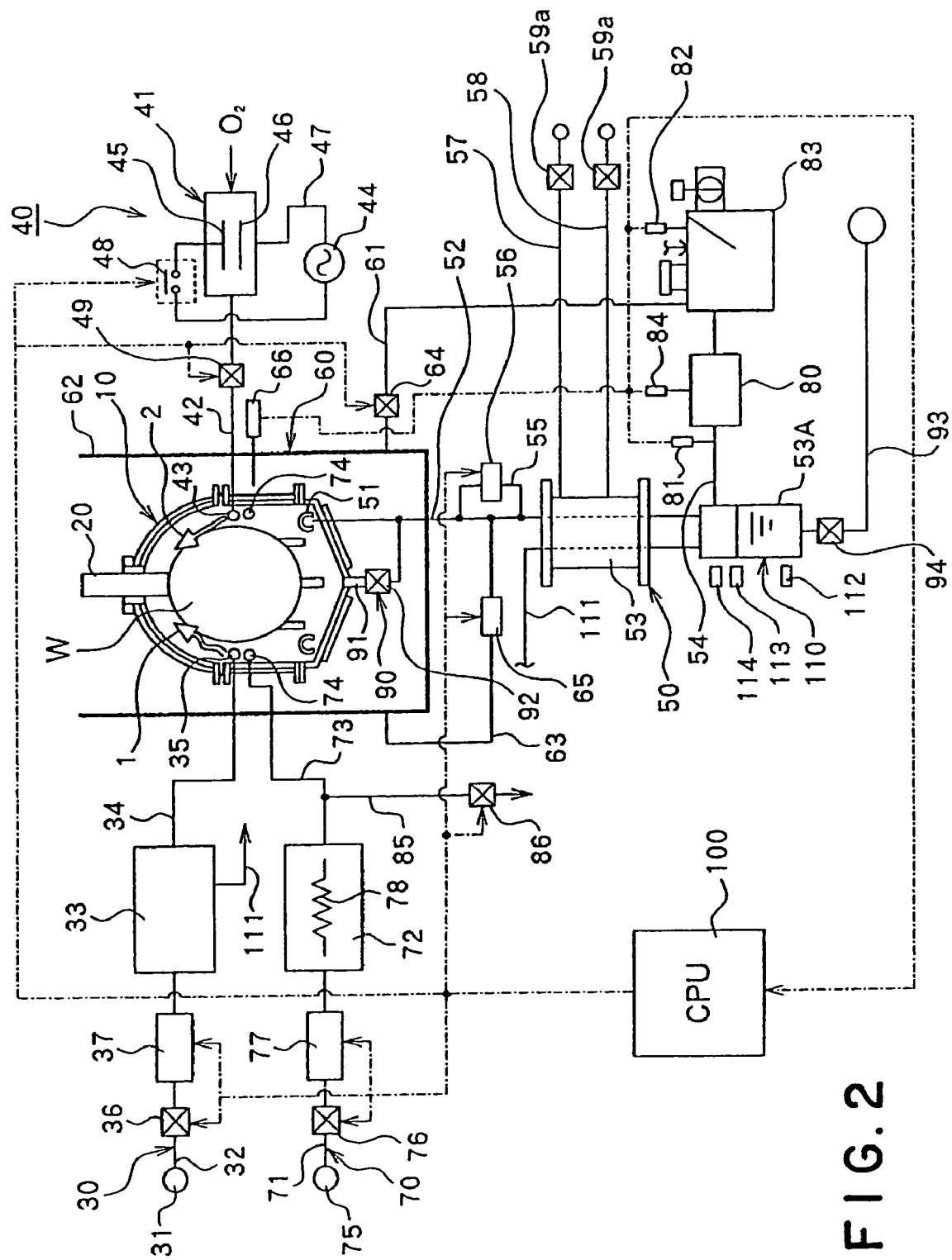
FIG. 2 is a diagrammatic sectional view of the substrate processing apparatus according to a first embodiment of the present invention.

FIG. 2 is a diagrammatic sectional view of the substrate processing apparatus according to the present embodiment. FIG. 3 is a sectional view of a major part of the substrate processing apparatus according to the present embodiment.

The substrate processing apparatus comprises a processing vessel 10 for processing a wafer W; a wafer guide 20 as holding means for holding the wafer in the processing vessel 10; steam feed means 30 which is solvent steam feed means (a solvent steam feed system) for feeding steam 1 as a solvent into the processing vessel 10; ozone gas feed means (an ozone gas feed system) 40 which is processing gas feed means for feeding a processing gas, e.g., ozone ($O_3$) gas 2 into the processing vessel 10; interior exhaust means (an interior exhaust system) 50 for discharging an interior atmosphere in the processing vessel 10; periphery exhaust means 60 (for discharging a peripheral atmosphere around the processing vessel 10); air feed means 70 for feeding hot air into the processing vessel 10; an ozone killer 80 as a post-treatment mechanism for removing ozone from the interior atmosphere discharged from the interior of the processing vessel 10; and exhaust means 90 for discharging an atmosphere in the processing vessel 10.

The processing vessel 10 comprises mainly the vessel body 11 of a size which can accommodate a plurality of sheets of wafers, e.g., 50 sheets of wafers, a vessel cover 12 for closing and opening a loading/unloading opening 14 formed in the upper end of the vessel body 11, and a vessel bottom 13 for closing an opening in the lower end of the vessel body 11.

The vessel cover 12 has, e.g., reversed U-shaped cross section and can be moved up and down by a lift mechanism 15. The lift mechanism 15 is connected to control means, e.g., a central computing unit (central controller) 100 (hereinafter called a CPU 100). The lift mechanism 15 is operated in response to a control signal from the CPU 100 to open or close the vessel cover 12. When the vessel cover 12 is lifted, the loading/unloading opening 14 is opened, and the wafers W can be loaded into the vessel body 11. The vessel cover 12 is lowered after the wafers W have been loaded into the vessel body 11, and the loading/unloading opening 14 is closed with a gap between the vessel body 11 and the vessel cover 12 tightly sealed with an expandable seal member 16 which is expanded with injected air. A gap between the vessel body 11 and a vessel bottom 13 is tightly sealed with a gasket 17. Thus, a tightly sealed atmosphere is established in the processing vessel 10, and no gas can leak outside.

As opening/closure detecting means for detecting opening/closure of the vessel cover 12, a weight sensor 18 is provided on the upper end of the vessel body 11. The weight sensor 18 detects a weight applied to the upper end of the vessel body 11 when the vessel cover 12 closes the loading/unloading opening 14. A detected signal of the weight sensor 11 is supplied to the CPU 100 as control means, and the CPU 100 confirms opening/closure of the vessel cover 12. For example, when the weight sensor 18 detects a prescribed weight, it is recognized that the vessel cover 12 has been perfectly closed.

A rubber heater 19a is mounted on the outside surface of the vessel body 11, and a rubber heater 19b is mounted on the outside surface of the vessel cover 12. A rubber heater 19c is mounted on the outside surface of a vessel bottom 13. The rubber heaters 19a, 19b, 19c are connected to electric power sources (not shown) and are heated by electric power supply from the electric power sources so that an interior atmosphere in the processing vessel 10 can be heated to a required temperature (within a range of, e.g., 80 to 120° C.). The rubber heaters 19a, 19b, 19c prevent dewing of the vessel body 11.

Figure 4:
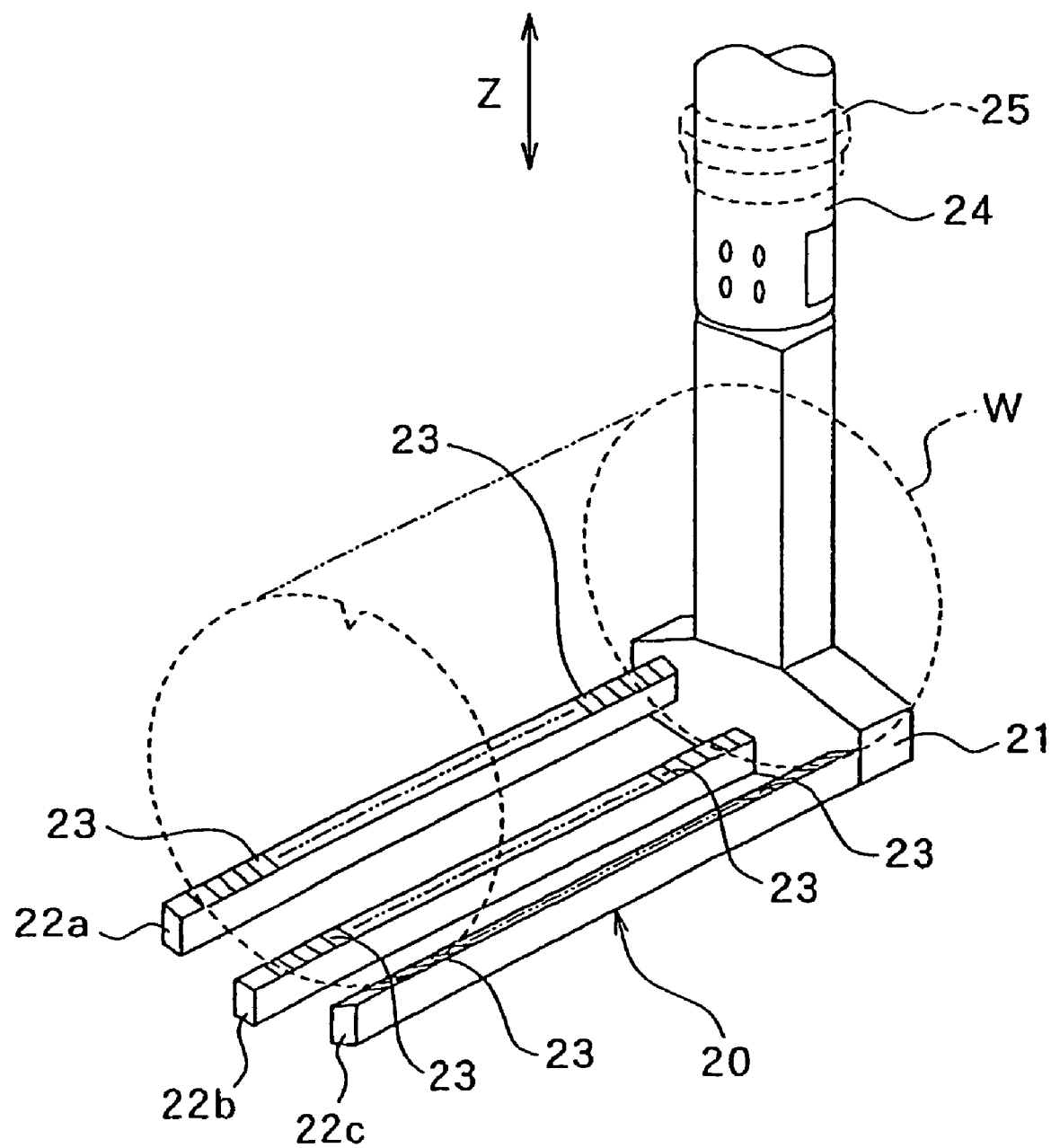
FIG. 4 is a perspective view of a wafer guide of the present invention.

As shown in FIG. 4, the wafer guide 20 comprises mainly a guide 21, and 3 holding members 22a, 22b, 22c which are secured to the guide 21 in parallel with each other. Grooves 23 for holding the wafers W vertically at the lower peripheral edges are formed in the respective holding members 22a, 22b, 22c at a certain pitch. Accordingly, the wafer guide 20 can carry 50 sheets of wafers W (for two wafer carriers), spaced equidistantly from each other. The wafer guide 20 has a shaft 24 connected to the guide 21, and the shaft 24 is passed slidably through a through-hole formed in the upper side of the vessel cover 12. A seal member 25 which is expandable with injected air is disposed between the through-hole and the shaft 24 so as to make the interior of the processing vessel 10 air- and water-tight.

The steam feed means 30 comprises mainly a pure water feed pipe 32 connected to a pure water supply source 31; a steam generator 33 for evaporating pure water fed through the pure water feed pipe 32 to generate steam 1; a steam feed pipe 34 for feeding the steam 1 in the steam generator 33; and a steam nozzle 35 for injecting the steam fed through the steam feed pipe 34 into the processing vessel 10.

The pure water feed pipe 32 has one end connected to the pure water supply source 31. An on-off valve 36 and a flow rate controller 37 are inserted in the pure water feed pipe 32 in the described order from the pure water supply source 31. The on-off valve 36 and the flow rate controller 37 are controlled in response to control signals from the CPU 100. That is, the on-off valve 36 is controlled to open or close to admit or not to admit the pure water to flow. The flow rate controller 37 is controlled to have an opening suitable for a flow rate of the pure water. A heater (not shown) is disposed inside the steam generator 33. The pure water fed into the stem generator 33 is evaporated by heat of the heater into steam 1. The steam generator 33 is connected to a discharge pipe 111 connected to a mist trap 110 which will be described later. The discharge pipe 111 discharges pure water which has not been evaporated in the steam generator 33 to the mist trap 110 or the steam 1 is discharged to the mist trap 110 until a temperature of the steam generator 33 and steam injection are stabilized.

The ozone feed means 40 comprises mainly ozone gas generating means (an ozone gas generator) 41; an ozone gas feed pipe 42 for feeding ozone gas 2 from the ozone gas generating means 41; and an ozone gas nozzle 43 for injecting the ozone gas 2 fed through the ozone gas feed pipe 42 into an ozone processing chamber 10a of the processing vessel 10.

The ozone generator 41 generates ozone gas ($O_3$) by passing oxygen ($O_2$) as a base gas to be a raw material between discharge electrodes 45, 46 which are connected to a high-frequency electric power source 44 which supplies a high-frequency voltage.

A switch 48 is inserted in an electric circuit 47 interconnecting the high-frequency electric power source 44, and the discharge electrodes 45, 46. The switch 48 is controlled in response to a control signal from the CPU 100. That is, the switch 48 is controlled based on whether or not ozone gas is to be generated. An on-off valve 49 is inserted in the ozone feed pipe 42 on the side of the ozone gas generating means 41. The on-off valve 49 is controlled in response to a control signal from the CPU 100. That is, the on-off valve 49 is controlled to open or close to admit or not to admit the ozone gas to flow.

The air feed means 70 comprises mainly an air feed pipe 71 for feeding air; a hot air generator 72 for heating the air fed through the air feed pipe 71 to generate hot air 3; a hot air feed pipe 73 for feeding the hot air 3 generated in the hot air generator 72, a pair of air nozzles 74 for discharging the hot air 3 fed through the hot air feed pipe 73.

The air feed pipe 71 has one end connected to an air supply source 75. An on-off valve 76 and a flow rate controller 77 are inserted in the air feed pipe 71 in the described order from the air supply source 75. The on-off valve 76 and the flow rate controller 77 are connected to the CPU 100, which is the control means. In response to control signals from the CPU 100, whether the air is to be fed, and a flow rate of the air are controlled. A heater 78 for heating the air is disposed in the hot air generator 72. The hot air feed pipe 73 is connected to an air inlet pipe 85 which releases the air into an exhaust manifold 83 which will be described later. An on-off valve 86 is inserted in the air inlet pipe 85. The on-off valve 86 is controlled by the CPU 100, which is the control means.

The interior exhaust means (interior exhaust system) 50 comprises mainly an exhaust portion 51 installed in the processing vessel 10; a first interior exhaust pipe 52 for exhausting an interior atmosphere in the processing vessel 10; a cooling unit 53 connected to the first interior exhaust pipe 52; a mist trap 110 including a liquid pool 53A connected to the cooling unit 53 at the downstream thereof; and a second interior exhaust pipe 54 connected to the mist trap 110 at the upstream thereof.

The exhaust portion 51 takes in an interior atmosphere in the processing vessel 10. The exhaust portion 51 is connected to the first interior exhaust pipe 52. A bypass pipe 55 is branched from the first interior exhaust pipe 52, and a forced exhaust mechanism 56 having an ejector mechanism is inserted in the bypass pipe 55. The forced exhaust mechanism 56 is connected to the CPU 100, which is the control means, (the forced exhaust mechanism 56 and the CPU 100 constitute "an exhaust rate adjusting system") to be operationally controlled by the CPU 100.

The cooling unit 53 cools and condenses the steam 1 discharged from the steam generator 33 and the steam 1 discharged from the processing vessel 10. The exhaust pipe 111 and the first interior exhaust pipe 52 are passed through the cooling unit 53, and a cooling water feed pipe 57 for feeding cooling water and a cooling water exhaust pipe 58 for discharging the cooling water are connected to the cooling unit 53. Flow rate adjusting valves 59a, 59b are inserted respectively in the cooling water feed pipe 57 and the cooling water discharge pipe 58 so as to adjust a feeding flow rate and a discharge rate of the cooling water.

The mist trap 110 separates gas and liquid to discharge them. That is, the exhaust portion 51 discharges the steam 1 and the ozone gas 2 in the processing vessel 10 to the mist trap 110 through the first interior exhaust pipe 52. The cooling unit 53 is supplied with cooling water through the cooling water feed pipe 57, and the steam 1 discharged out of the processing vessel 10 is cooled to be condensed while being passed through the cooling unit 53. Liquid drops of the steam 1 which has been condensed and liquefied are dropped into the liquid pool 53A of the mist trap 110. On the other hand, the ozone gas 2 is introduced as it is into the mist trap 110. The interior atmosphere thus discharged out of the processing vessel 10 is separated into the ozone gas 2 and the liquid drops. The separated ozone gas 2 is discharged into the second interior exhaust pipe 54 while the liquid drops are discharged into a second liquid drain pipe 93. The steam 1 and the pure water discharged out of the steam generator 33 is introduced into the mist trap 110 through a discharge pipe 111. The pure water flows as it is through the discharge pipe 111. The steam 1 is cooled to be condensed while being passed through the cooling unit 53, to be dropped in liquid drops into the mist trap 110.

A first concentration sensor 81 as concentration detecting means for detecting an ozone concentration in the discharged interior atmosphere, and a ozone killer 80 are inserted in the second interior exhaust pipe 54, and the exit of the second interior exhaust pipe 54 is connected to an exhaust manifold 83.

The first concentration sensor 81 in the second interior exhaust pipe 54 is positioned upstream of the ozone killer 80. The first concentration sensor 81 detects an ozone concentration of the discharged interior atmosphere before the discharged interior atmosphere flows into the ozone killer 80, so as to detect an ozone concentration in the processing vessel 10. The first concentration sensor 81 is connected to the CPU 100, which is the controller. A detected signal of the first concentration sensor 81 is supplied to the CPU 100, and the CPU 100 controls the opening and closure of the vessel cover 12, based on an ozone concentration detected by the first concentration sensor 81. The control of the opening/closure of the vessel cover 12 is so set that the vessel cover 12 is not opened, e.g., unless an ozone concentration in the processing vessel 10 is below a preset value (e.g., 0.1 ppm which is harmless to the human body). Such consideration is made for safety.

The ozone killer 80 thermally decomposes the ozone by heating into oxygen. A heating temperature of the ozone killer 80 is set at, e.g., above 400° C. Preferably, the ozone killer 80 is connected to an interruptible power supply (not shown) for stable electric power supply even in a power failure, so that the ozone killer 80 can be operated even in a power failure to remove the ozone for the safety.

The ozone killer 80 has a temperature sensor 84 as operation detecting means for detecting an operational state of the ozone killer 80. The temperature sensor 84 detects a heating temperature of the ozone killer 80. The temperature sensor 84 is connected to the CPU 100, which is the controller. A detected signal of the temperature sensor 84 is supplied to the CPU 100, and, based on the detected signal, the CPU 100 judges whether or not the ozone killer 80 is sufficiently ready for removing the ozone.

The exhaust manifold 83 collects exhausts of the apparatus. That is, the exhaust manifold 83 is connected to the second interior exhaust pipe 54, the air inlet pipe 85 and a first periphery exhaust pipe 61 which will be described alter. A plurality of pipes (not shown) behind the processing apparatus for taking in an atmosphere are provided for the prevention of diffusion of the ozone gas 2 out of the processing apparatus. The exhaust manifold 83 is connected to an acid exhaust for acid only in the plant to function as a junction of the various exhausts before they are sent to the acid exhaust for acid only.

A second concentration sensor 82 for detecting an ozone concentration is disposed in the exhaust manifold 83. The second concentration sensor 82 disposed in the exhaust manifold 83 is connected to the CPU 100, which is the controller. A detected signal of the second concentration sensor 82 is supplied to the CPU 100, and, based on an ozone concentration detected by the second concentration sensor 82, the CPU 100 recognizes the ozone removing ability of the ozone killer 80 so as to monitor leakage of the ozone gas due to malfunctions of, e.g., the ozone killer 80.

The peripheral exhaust means 60 comprises mainly a case 62 covering the processing vessel 10; a first peripheral exhaust pipe 61 having one end connected to a lower part of the case 62 and the other end connected to the exhaust manifold 83; and a second peripheral exhaust pipe 63 having one end connected to a lower part of the case 62 and the other end connected to the first interior exhaust pipe 52.

In the case 62, clean air is fed in a down flow from above to prevent an interior atmosphere in the case 62, i.e., a peripheral atmosphere around the processing vessel 10 from leaking outside while pushing the peripheral atmosphere downward so that the peripheral atmosphere can easily enter, the first periphery exhaust pipe 61 and the second periphery exhaust pipe 63. A second concentration sensor 66 as peripheral concentration detecting means for detecting an ozone concentration of the peripheral atmosphere of the processing vessel 10 is disposed in the case 62. The second concentration sensor 66 is connected to the CPU 100, which is the controller. A detected signal of the second concentration sensor 66 is supplied to the CPU 100, and based on an ozone concentration detected by the second concentration sensor 66, the CPU 100 detects leakage of the ozone gas 2.

An on-off valve 64 is inserted in the first periphery exhaust pipe 61. The on-off valve 64 is connected to the CPU 100, which is the controller. The CPU 100 opens the on-off valve 64 while the processing is going on in a clean condition. Meanwhile, the first periphery exhaust pipe 61 exhausts the peripheral atmosphere of the processing vessel 10 into the exhaust manifold 83.

A periphery forced exhaust mechanism 65 having an ejector mechanism is disposed in the second periphery exhaust pipe 63. The periphery forced exhaust mechanism 65 draws the peripheral atmosphere around the processing vessel 10 quickly to thereby send the peripheral atmosphere under pressure to the mist trap 110 for forced exhaust. The peripheral forced exhaust mechanism 65 is connected to the CPU 100, which is the controller. The operation of the periphery forced exhaust mechanism 65 is controlled in response to a control signal of the CPU 100. While the peripheral forced exhaust mechanism 65 is normally operating, the CPU 100 outputs no control signal, and the operation of the peripheral forced exhaust mechanism 65 is stopped.

The exhaust means 90 comprises a first drain pipe 91 connected to the bottom of the processing vessel 10 and to the first interior exhaust pipe 52; and a second liquid drain pipe 93 connected to the bottom of the mist trap 110. An on-off valve 92 is inserted in the first liquid drain pipe 91. An on-off valve 94 is inserted in the second liquid drain pipe 93.

The second liquid drain pipe 93 is communicated with the acid drain for acid only in the plant, because ozone may remain in the liquid.

In the mist trap 110, an emptiness preventing sensor 112, drainage start sensor 113 and a liquid over sensor 114 are arranged in the described order from below. Although not shown, the on-off valves 92, 94 and the respective sensors 112, 113, 114 are connected to the CPU 100, which is the controller. The CPU 100 controls opening and closing of the on-off valves 92, 94, based on detected signals of the sensors 112, 113, 114. That is, when liquid drops are stored to some extent in the mist trap 110, and the liquid surface is detected by the drainage start sensor 113, a detected signal of the drainage start sensor 113 is supplied to the CPU 100. In response to a control signal of the CPU 100, the on-off valve 94 is opened, and the drainage is started. A liquid surface height arrives at the liquid over sensor 114, an alarm signal of the liquid over sensor 114 is inputted to the CPU 100. Contrarily, when a liquid surface is below the emptiness preventing sensor 112, a prohibition signal of the emptiness preventing sensor 112 is inputted to the CPU 100. In response to the control signal of the CPU 100, the on-off valve 94 is closed. The emptiness preventing sensor 112 can prevent the mist trap from being empty as a result all liquid drops flow out of the mist trap 110, and prevent the ozone gas 2 from leaking into the acid exhaust for acid only in the plant.

Next, the operation of the substrate processing apparatus according to the prevent invention will be explained with reference to FIG. 3 and FIGS. 5 to 8. A plurality of wafers, e.g., 50 sheets of wafer W which have been carried by wafer carrying means (not shown) are transferred onto the wafer guide 20, which is movable upward above the vessel body 11 of the processing vessel 10. Then, after the wafer guide 20 has been lowered, the vessel cover 12 is closed, and the wafers W are held in the tightly closed processing vessel 10.

Figure 5:
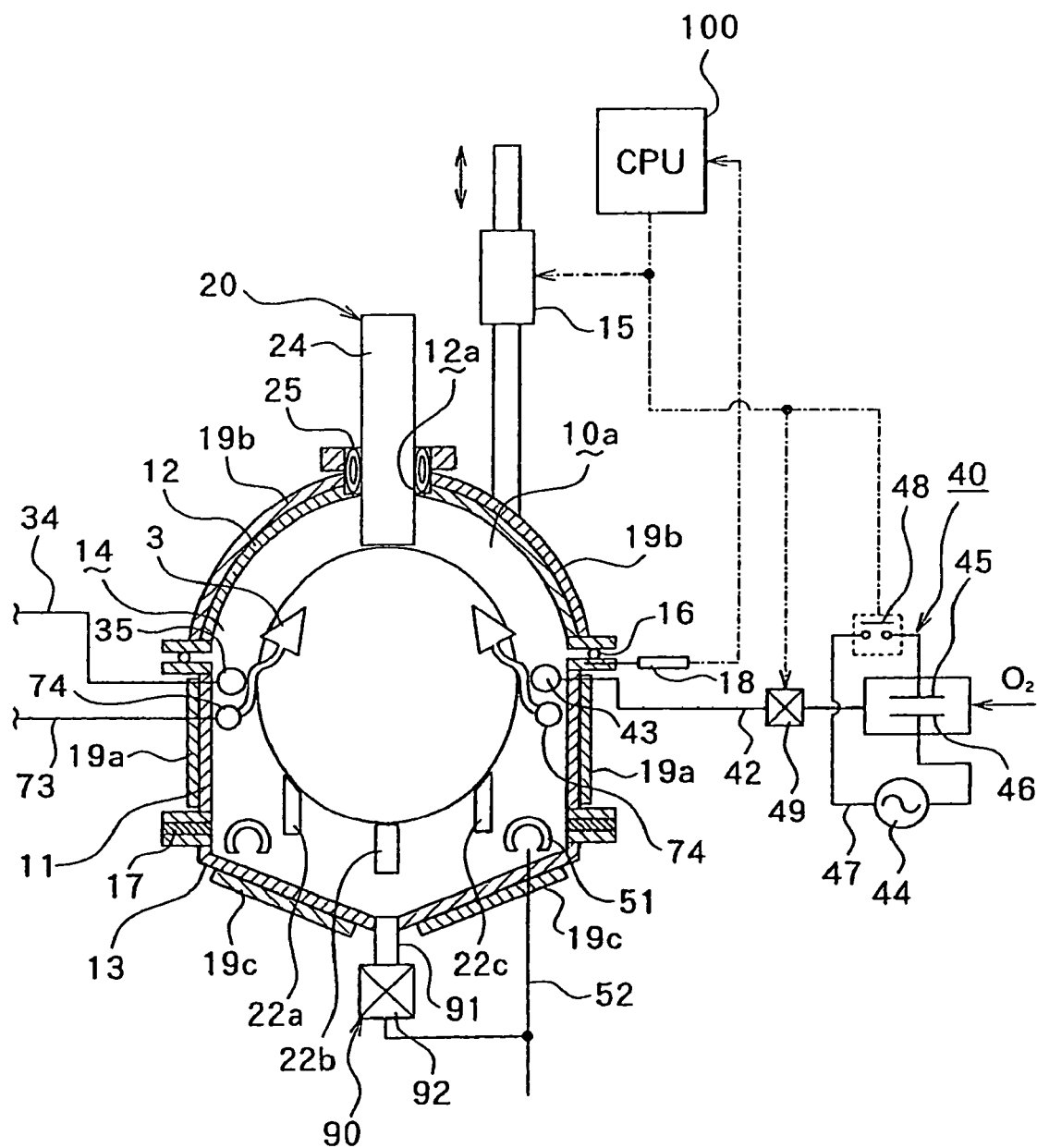
FIG. 5 is a diagrammatic sectional view of the substrate processing apparatus according to the first embodiment in a state where hot air is fed to the wafers in the processing vessel.

With the wafers W held in the processing vessel 10, first the on-off valve 76 of the air feed means 70 is opened while the hot air generator 72 is actuated. As shown in FIG. 5, hot air 3 heated up to about 280° C. is fed into the processing vessel 10, and the wafers W and the interior atmosphere of the processing vessel 10 are raised from the normal temperature (25° C.) to a required temperature (e.g., 80-90° C.). Preferably, the required temperature is set to be above a dew point of a solvent and below a temperature of solvent vapor, and within a range of temperatures optimum for processing.

Figure 6:
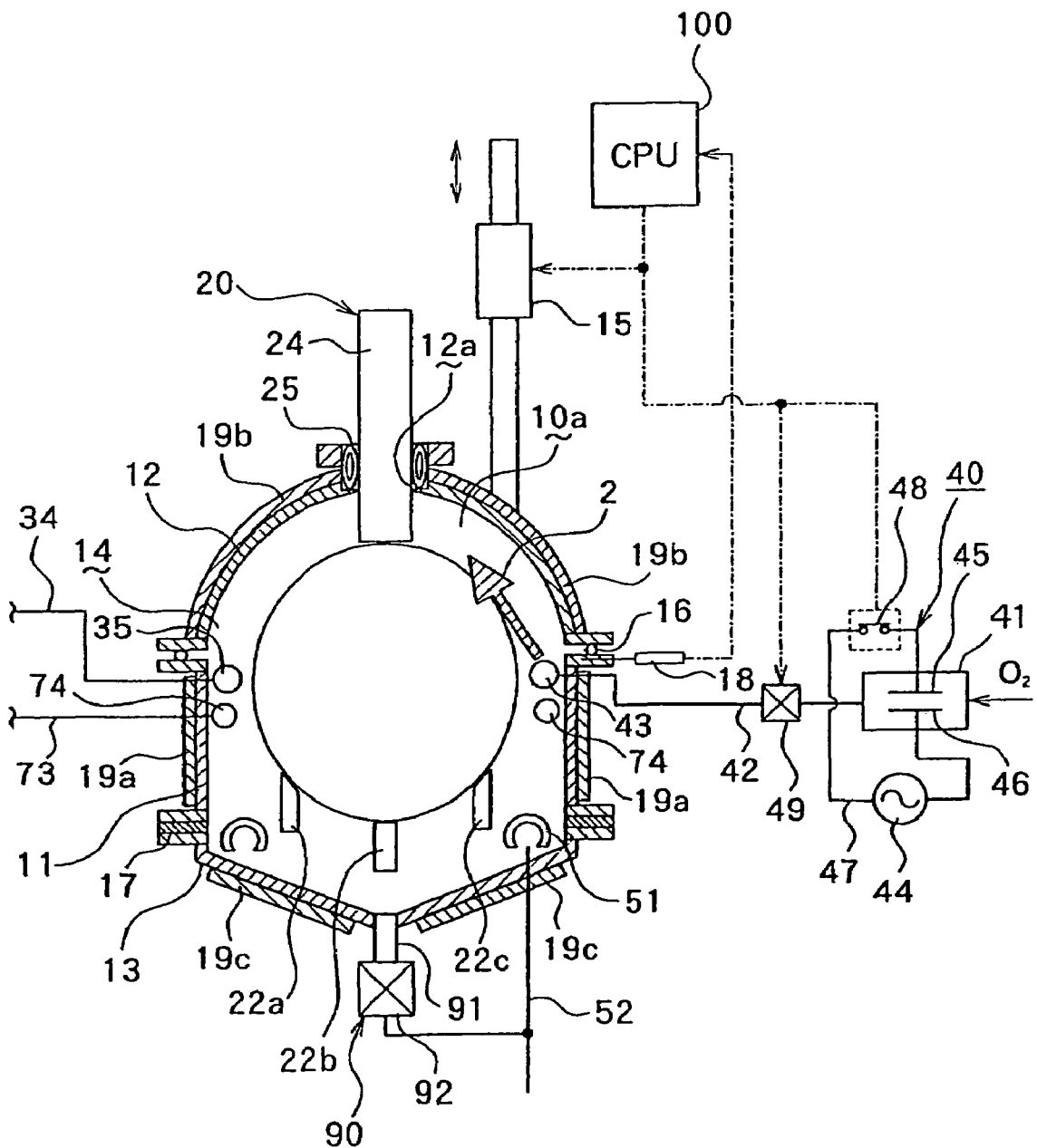
FIG. 6 is a diagrammatic sectional view of the substrate processing apparatus according to the first embodiment in a state where ozone gas is fed to the wafers in the processing vessel.

Then, as shown in FIG. 6, the ozone gas generating means 41 as the ozone gas feed means is actuated, and a high-frequency voltage is applied to fed oxygen ($O_2$) to generate ozone ($O_3$) gas. The on-off valve 49 is opened to feed the ozone gas 2 into the processing vessel 10, and the wafers W and the atmosphere in the processing vessel 10 are pre-pressurized. The ozone gas 2 of an about 9 vol % (volume percentage) concentration is fed at an about 10 l/min, and a pressure in the processing vessel 10 can be 0.01-0.03 MPa, which is higher than an atmospheric pressure (0.1 MPa) adjusted to be zero. Thus, the atmosphere in the processing vessel 10 can be of ozone alone. Accordingly, stable oxide films can be formed on the surfaces of the wafers W, and the metal corrosion can be prevented.

After a required period of time of pre-pressurizing the interior of the processing vessel 10, the steam feed means 30 is actuated with the ozone gas generating means 41 set on, to feed steam 1 into the processing vessel 10 together with the ozone gas. With a reaction substance produced by the steam 1 (solvent vapor) and the ozone gas (processing gas), the wafers W are processed, i.e., a resist is removed from the wafers W (see FIG. 3). At this time, the pre-pressurization maintains a pressure in the processing vessel 10 to be higher by 0.01-0.03 MPa than the atmosphere (0.1 MPa) adjusted to be zero, whereby a mixed amount of ozone molecules with respect to water molecules is increased to produce a large amount of hydrogen oxide radicals. Accordingly, even when the ozone gas generating means 41, in which the ozone gas feed means 40 ozonizes hydrogen ($O_2$) alone by discharging, is used, sufficient processing for removing a resist can be performed. Furthermore, the processing using ozone can be performed in the atmosphere of high temperature, which makes the processing ability higher.

Figure 7:
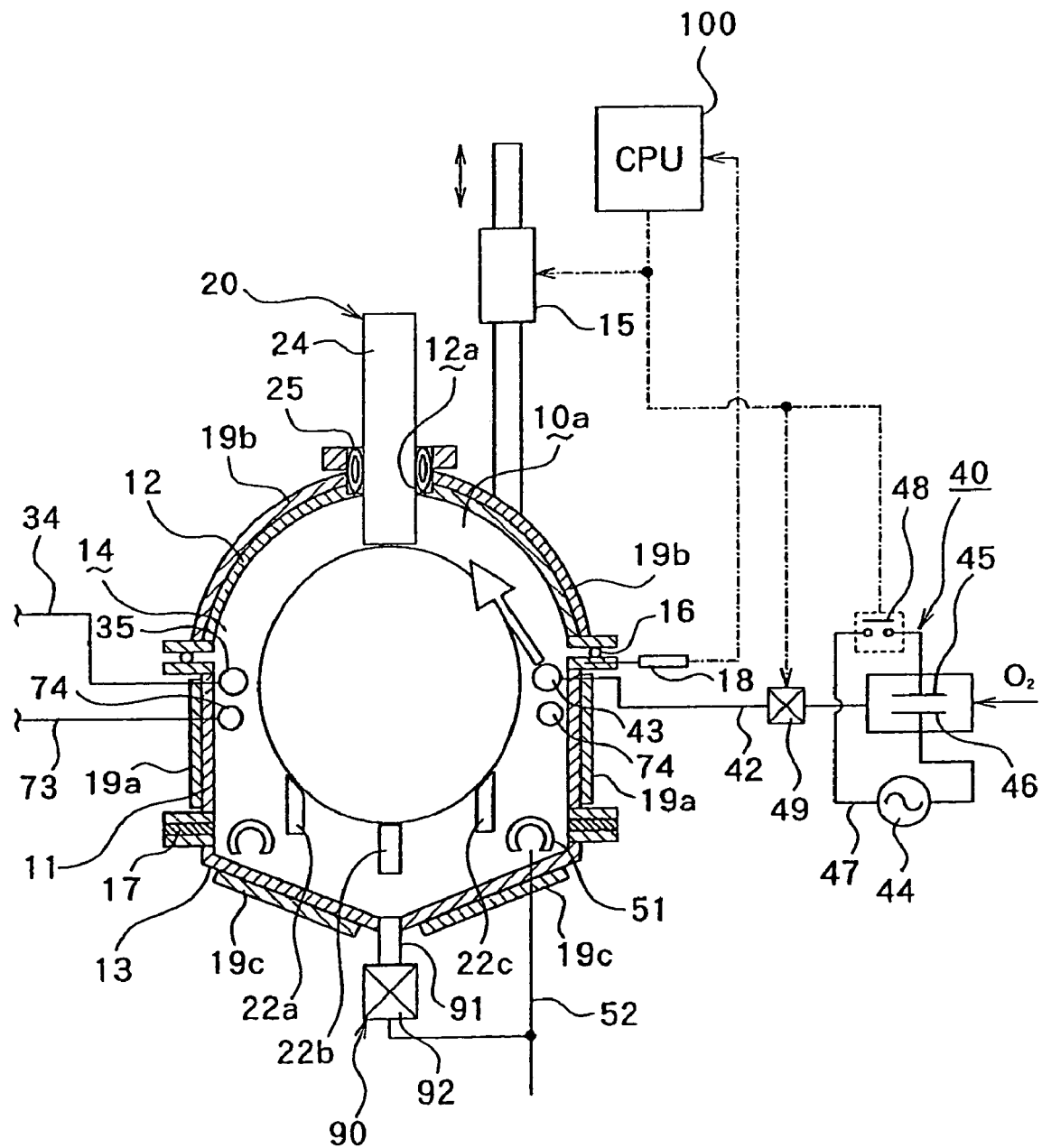
FIG. 7 is a diagrammatic sectional view of the wafer processing apparatus in a state where oxygen gas is fed to the wafers in the processing vessel.
Figure 8:
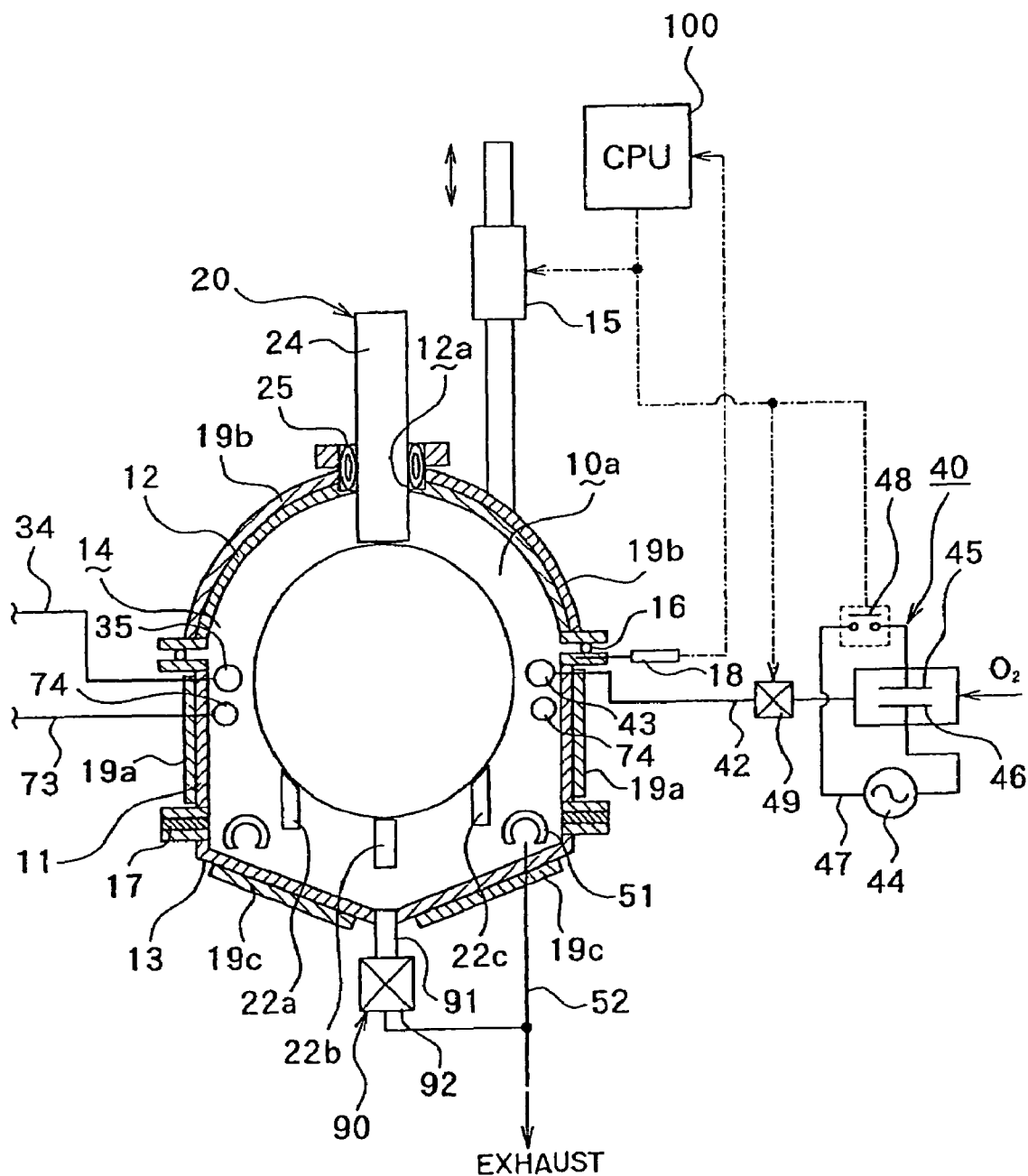
FIG. 8 is a diagrammatic sectional view of the wafer processing apparatus in a state where an atmosphere in the processing vessel is exhausted.

After the processing has been performed for a required period of time (e.g., 3-6 minutes) under an internal pressure of the processing vessel 10 higher by 0.05 MPa than an atmospheric pressure (0.1 MPa) adjusted to be zero, although the internal pressure of the processing vessel 10 depends on a kind of a resist, the feed of the steam from the steam feed means 30 is stopped while the operation of the ozone gas generating means 41 is stopped, and oxygen ($O_2$) as the base gas alone is fed into the processing vessel 10, whereby abrupt decrease of the pressure in the processing vessel 10 is prevented (see FIG. 7). Accordingly, the steam in the processing vessel 10 is prevented from dewing and staying on the wafers W.

After a required period of time (e.g., 10 minutes) of the oxygen feed, the oxygen feed is stopped, and then the forced exhaust mechanism 56 is actuated to forcedly discharge the steam and ozone residing in the processing vessel 10. Thus, the processing is completed (see FIG. 8). At this time, the on-off valve 92 is opened to drain liquid staying at the bottom of the processing vessel 10.

Then, the lift mechanism 15 is actuated to lift the vessel cover 12, opening the loading/unloading opening 14 of the vessel body 1. Then, the wafer guide 20 is lifted above the processing vessel 10 to unload the wafers out of the processing vessel 10. Then, the wafers W are transferred onto the wafer carrying means (not shown) to be carried to a cleaning processing unit for cleaning with pure water. In the cleaning processing unit, the wafers W have the resist cleaned off in the cleaning processing unit.

Thus, the above-described substrate processing is applicable not only to the removal of resists and prevention of metal corrosion and particles of wafers W which are subjected to wiring steps, but also to the removal of resists and prevention of metal corrosion and particles of wafers W which are not subjected to wiring steps.

Figure 9:
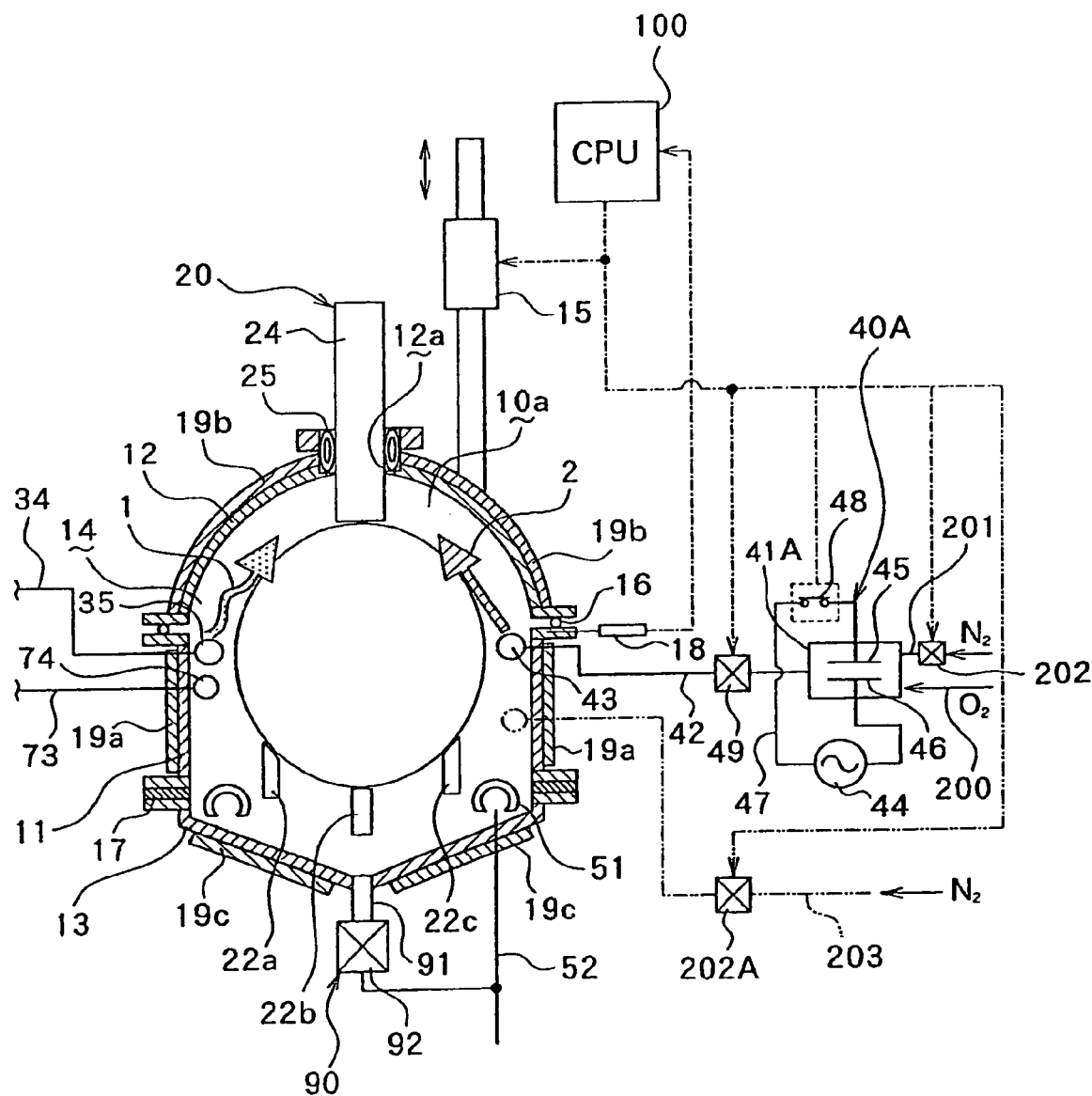
FIG. 9 is a sectional view of a major part of the wafer processing apparatus according to a second embodiment of the present invention of the present invention.

FIG. 9 is a sectional view of a major part of the substrate processing apparatus according to a second embodiment of the present invention. In the first embodiment, for the resist removal of wafers W and prevention of metal corrosion and particles, the ozone gas feed means 40, which is the processing gas feed means, ozonizes oxygen ($O_2$) alone by discharging. In the present embodiment, oxygen ($O_2$) and nitrogen ($N_2$) are fed to the ozone gas generating means 41 of the ozone gas feed means 40 which is processing gas feed means, whereby the ozonization is made more efficient, a feed amount of nitrogen is controlled to remove resists, and etching rates of metals can be controlled.

That is, in the present embodiment, a nitrogen gas feed pipe 201 for feeding nitrogen besides an oxygen feed pipe 200 for feeding oxygen is connected to an ozone generating means 41A of ozone gas feed means 40 which is processing gas feed means. A nitrogen gas flow rate control valve 202 inserted in the nitrogen gas feed pipe 201 is connected to a CPU 100 (the nitrogen gas flow rate control valve 202 and the CPU 100 constitutes "a nitrogen gas controller"), and the nitrogen gas flow rate controller 202 is controlled in response to a control signal of the CPU 100 to thereby adjust a content of nitrogen in ozone gas.

Nitrogen as well as oxygen is fed to the ozone gas generating means 41A, whereby oxygen molecules and nitrogen molecules staying on discharge electrodes 45, 46 of the ozone generating means 41A are decomposed to thereby improve the ozone generating efficiency. Nitrogen contained in the ozone gas 2 contacts metals of the wafers W, such as aluminum (Al), tungsten (W), etc., and the metals can be etched. Flow rates of the nitrogen is controlled to thereby control etching rates of metals. Accordingly, the substrate processing according to the present embodiment is suitable for resist removal and metal etching of wafers W which are not subjected to wiring steps.

In the present embodiment, nitrogen ($N_2$) is fed to the ozone gas generating means 41A to control a flow rate of nitrogen ($N_2$) in the ozone gas. However, as indicated by the two-dot-line in FIG. 9, it is possible that the nitrogen gas feed pipe 203 is connected to the processing vessel 10, and the nitrogen gas flow rate control valve 202A inserted in the nitrogen gas feed pipe is controlled by the CPU 100, which is the control means, to feed nitrogen ($N_2$) directly into a processing chamber 10a of the processing vessel 10.

The rest part of the second embodiment is the same as that of the first embodiment described above, and the same members as those of the first embodiment are represented by the same reference numbers not to repeat their explanation.

Figure 1A:
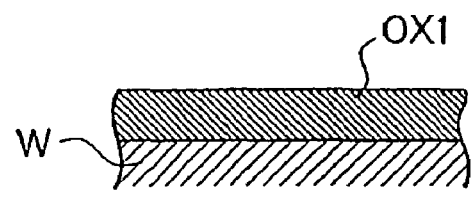
FIG. 1A is a diagrammatic sectional view of a substrate-to-be-processed in the first oxide film forming step of the conventional wafer processing method, which explains one example of the method.
Figure 1B:
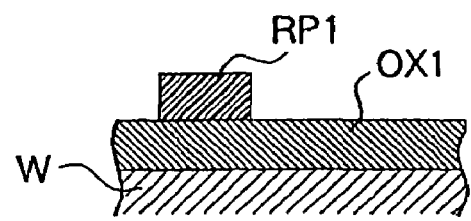
FIG. 1B is a diagrammatic sectional view of the substrate-to-be-processed in the first resist pattern forming step of the conventional wafer processing method, which shows one example of the method.
Figure 1C:
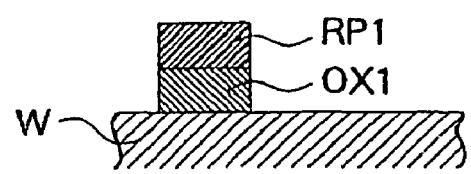
FIG. 1C is a diagrammatic sectional view of the substrate-to-be-processed in the first etching step of the conventional wafer processing method, which shows one example of the method.
Figure 1D:
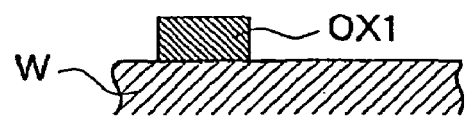
FIG. 1D is a diagrammatic sectional view of the substrate-to-be-processed in the first resist removing step of the conventional wafer processing method, which shows one example of the method.

In the second embodiment described above, a flow rate of nitrogen is controlled to remove resists from wafers W and to control etching rates of metals. It is possible that a flow rate of nitrogen is controlled to suppress growth of oxide films. That is, the processing method according to the present invention is applied to the first resist removing step (see FIG. 1D) of the processing steps shown in FIG. 1, whereby growth of chemical oxide films on the surfaces of wafers W can be suppressed. Film thickness evenness and film quality of thin films can be improved.

In the above-described embodiments, the substrate-to-be-processed is wafer W. However, the substrate-to-be-processed is not essentially wafer W and may be, e.g., LCD substrate, substrate, as of CD, etc. as long as the substrate has resists applied to or metal films applied to.

EXAMPLES

Example 1

Experiments were made under the following conditions on etching rates of metals in the case where ozone gas contains nitrogen ($N_2$) and in the case where ozone gas contains no nitrogen ($N_2$).

Experiment Conditions:

A) Specimen metals: aluminum (Al), copper (Cu) and tungsten (W)

B) Processing conditions:

1) For the case where ozone gas contains nitrogen ($N_2$):

Pressure: 70.0[kPa]

Wafer temperature: 80[°C.]

Steam temperature: 115[°C.]

Processing period of time: 5 [min]

2) For the case where ozone gas contains no nitrogen ($N_2$):

Pressure: 70.0[kPa]

Wafer temperature: 80[°C.]

Steam temperature: 115[°C.]

Processing period of time: 5 [min]

Figure 10:
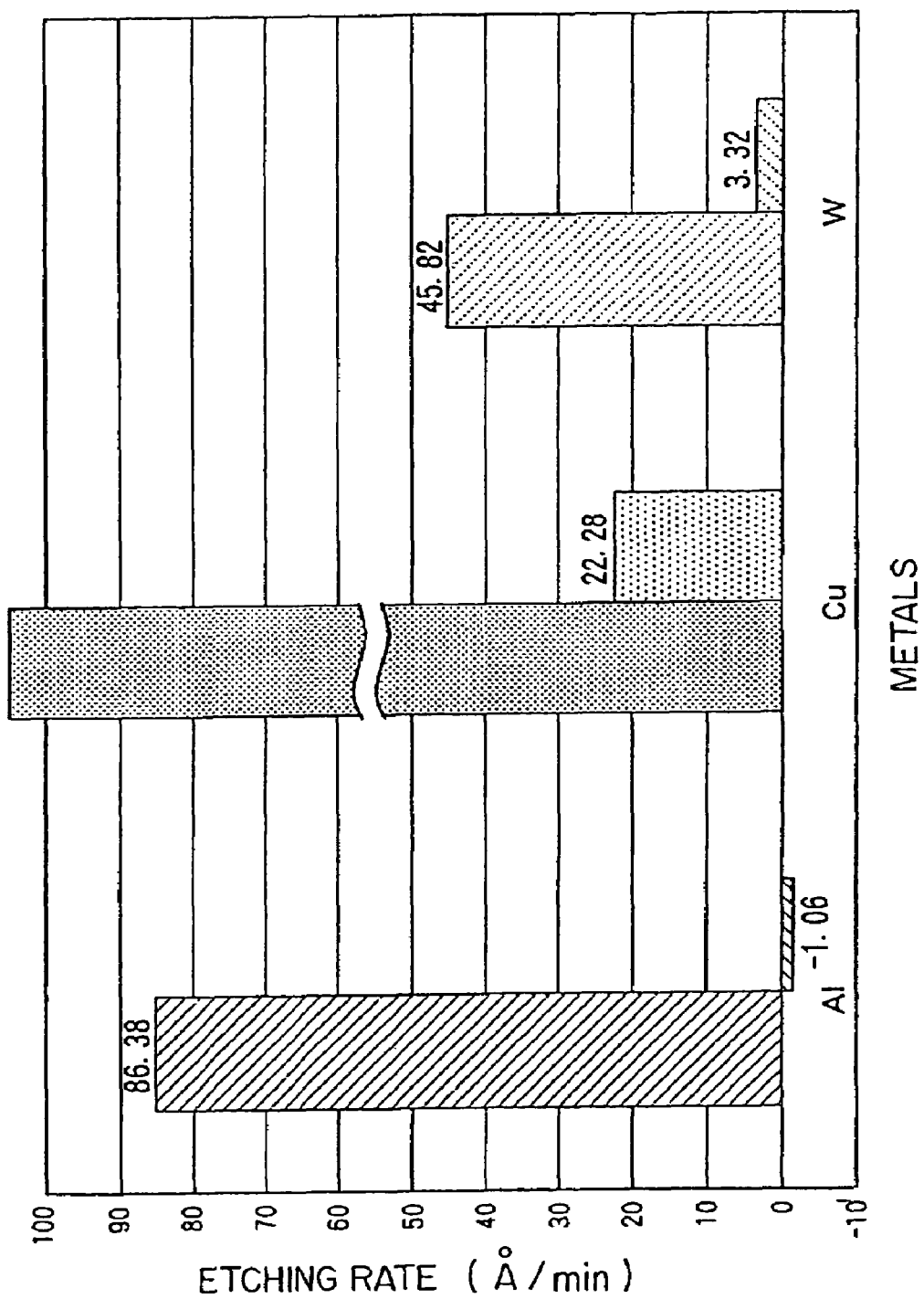
FIG. 10 is a graph of etching rates of aluminum (Al), copper (Cu) and tungsten (W) in a case where ozone gas contains nitrogen ($N_2$) gas and a case where ozone gas contains no nitrogen ($N_2$) gas.

The experiments were conducted under the above-described conditions, and the results of the experiments are as shown in FIG. 10.

The aluminum (Al) specimen had an etching rate of 86.38 [angstrom/min] in the case where ozone gas contained nitrogen ($N_2$), and in the case where ozone gas alone was used, the aluminum (Al) specimen was not almost etched, and an etching rate was −1.06 [angstrom/min]. The copper (Cu) specimen had an etching rate of above 100 [angstrom/min] in the case where ozone gas contained nitrogen ($N_2$), and in the case where ozone alone was used, the copper (Cu) specimen was 2.28 [angstrom/min]. The tungsten (W) specimen had an etching rate of 45.82 [angstrom/min] in the case where ozone gas contains nitrogen ($N_2$), and in the case where ozone gas alone was used, the tungsten (W) specimen had an etching rate of 3.32 [angstrom/min].

The results of the experiments described above show that metals, such as aluminum (Al), copper (Cu), tungsten (W), etc., can be etched at large etching rates when ozone gas contains nitrogen ($N_2$). By suitably changing the content of nitrogen ($N_2$), i.e., conditions of pressure, temperature, etc., etching rates of the above-described metals can be controlled.

Example 2

Experiments were made under the following conditions on growth rates of chemical oxide films in cases of resist removal processing using ozone gas having different nitrogen addition amounts (contents).

Ozone gas: 10 l/min ($N_2$ added; No $N_2$ added)

Steam: 120° C.

Wafer temperature: 90° C.

Pressure: 0.05 MPa (Zero-adjusted atmospheric pressure (0.1 MPa))

Ozone gas/steam feed period of time: 5 minutes $N_2$ feed rate: 0.08 l/min

The experiments were made under the above-described conditions, and the results shown in TABLE 1 were obtained.

TABLE 1

| | Oxide film thickness before processed | Oxide film thickness after processed | Oxide film growth amount |
|---|---|---|---|
| Processed with ozone gas with $N_2$ added | 3.35 [angstrom] | 16.90 [angstrom] | 13.55 [angstrom] |
| processed with ozone gas without $N_2$ added | 3.70 [angstrom] | 11.23 [angstrom] | 7.54 [angstrom] |

According to the results of the above-described experiments, in the case where the resist removing processing was performed with ozone gas ($O_3$ concentration: 10%) with $N_2$ added, a thickness of an oxide film was 3.35 [angstrom] before the processing, and was 16.90 [angstrom] after the processing, and a growth amount of the oxide film was 13.55 [angstrom]. In contrast to this, in the case where the resist removing processing was performed with ozone gas ($O_3$ concentration: 4%) without $N_2$ added, a thickness of an oxide film was 3.70 [angstrom] before the processing and was 11.23 [angstrom] after the processing, and a growth amount of the oxide film was 7.54 [angstrom].

Accordingly, it is found that the resist removing processing with ozone gas without $N_2$ added can depress the growth amount of the oxide film by 13.55−7.54=6.01 [angstrom] in comparison with the resist removing processing with ozone gas with $N_2$ added.

Figure 1E:
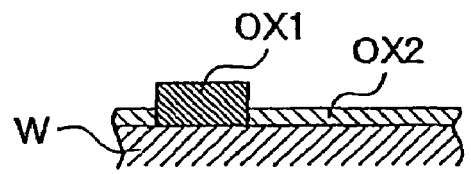
FIG. 1E is a diagrammatic sectional view of the substrate-to-be-processed in the second oxide film forming step of the conventional substrate processing method, which explains one example of the method.
Figure 1F:
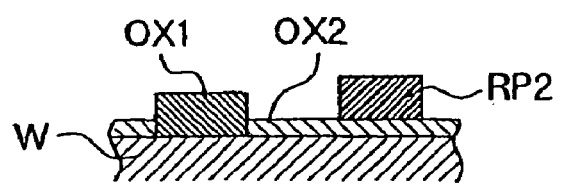
FIG. 1F is a diagrammatic sectional view of the substrate-to-be-processed in the second resist pattern forming step of the conventional wafer processing method, which explains one example of the method.
Figure 1G:
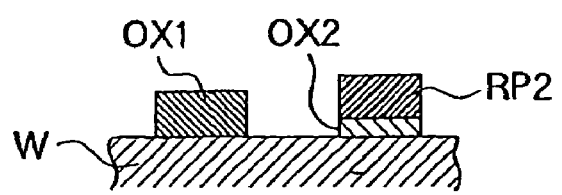
FIG. 1G is a diagrammatic sectional view of the substrate-to-be-processed in the second etching step of the conventional substrate processing method, which explain one example of the method.
Figure 1H:
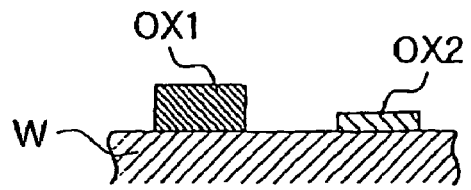
FIG. 1H is a diagrammatic sectional view of the substrate-to-be-processed in the second resist removing step of the conventional substrate processing method, which explains one example of the method.

The thin film $OX_2$ of FIG. 1E, which is usually formed by, e.g., furnace processing is usually required to have a 10-15 [angstrom]-thickness. However, the processing with ozone gas with $N_2$ added as described above increases the thickness of the oxide film before processed to 16.90 [angstrom], which exceeds the required maximum thickness value 15 [angstrom]. However, when the processing with ozone gas without $N_2$ added is performed, the oxide film thickness after processed is 11.23 [angstrom], which is within the required film thickness range. The thin oxide film after processed can have, by furnace processing, improved film quality (higher density) and even thickness.

In the above-described experiments, $N_2$ feed amounts were 0.08 l/min and 0. However, the growth of an oxide film can be optionally controlled in the resist removing processing by experimentally obtaining thickness of an oxide film before and after the resist removing processing, based on $N_2$ feed amounts other than the above-described $N_2$ feed amounts, obtaining experimental data of the other conditions, and storing the thus-obtained data in the CPU 100, which is the control means.

As described above, the present invention has the above-described constitution, which produces the following effects.

1) According to the present invention, before a processing gas is fed to the substrate-to-be-processed in the processing vessel to process the substrate-to-be-processed, the processing gas is fed into the processing vessel to pressurize the atmosphere surrounding the substrates, whereby the atmosphere in the processing vessel is replaced by an atmosphere of the processing gas while the interior of the processing vessel is pre-pressurized. Accordingly, the risk that the substrate-to-be-processed may contact gases, etc. other than the processing gas is avoided, and metal contamination and generation of particles can be accordingly prevented. Rates of the reaction between solvent vapor and the processing gas fed into the processing vessel are increased to thereby improve efficiency of the processing.

2) According to the present invention, in the state that the atmosphere in the processing vessel is replaced by an atmosphere of a processing gas while pre-pressurizing the interior of the processing vessel, the substrate-to-be-processed is processed with solvent steam and the processing gas. Then, the feed of the solvent vapor is stopped while the generation of the processing gas is stopped, and a base gas of the processing gas is fed into the processing vessel, whereby abrupt depressurization in the processing vessel can be suppressed to prevent the solvent vapor from dewing. In addition to the effect described above in item 1), liquid drops are prevented from staying on the substrates-to-be-processed, and yields can be accordingly increased.

3) According to the present invention, in the state that the atmosphere in the processing vessel is replaced by an atmosphere of a processing gas while pre-pressurizing the interior of the processing vessel, the substrate-to-be-processed is processed with solvent vapor and the processing gas. Then, the feed of the solvent vapor is stopped while the generation of the processing gas is stopped, and a base gas of the processing gas is fed into the processing vessel, whereby abrupt depressurization in the processing vessel can be suppressed to prevent the solvent vapor from dewing. Then, the feed of the base gas is stopped, and the atmospheric gas in the processing vessel can be exhausted. Thus, in addition to the effects described in items 1) and 2), the substrate-to-be-processed can be continuously processed with the solvent vapor and the processing gas without causing metal contamination to the substrate-to-be-processed and generation of particles. Consequently, efficiency of the processing can be improved.

4) The interior of the processing vessel is adjusted to have a required temperature before a processing gas is fed into the processing vessel, which permits solvent vapor to be fed to the substrate-to-be-processed after the substrate-to-be-processed has been heated to the required temperature. In addition to the effects described in items 1), 2) and 3), a layer of the solvent molecules can be formed in high density on the surfaces of the substrate-to-be-processed without failure, and a large amount of a reaction product can be produced to thereby improve efficiency of the processing.

5) According to the present invention, before a solvent vapor and ozone gas are fed to the substrate-to-be-processed in the processing vessel to process the substrate-to-be-processed, ozone gas is fed into the processing vessel to pressurize the atmosphere surrounding the substrates, whereby the atmosphere in the processing vessel is replaced by an atmosphere of ozone gas while the interior of the processing vessel is pre-pressurized. Accordingly, the risk that the substrate-to-be-processed may contact gases, etc. other than ozone gas is avoided, and metal contamination and generation of particles can be accordingly prevented. Rates of the reaction between the solvent vapor and the ozone gas fed into the processing vessel are increased to thereby improve efficiency of the processing. Furthermore, a feed rate of nitrogen gas is controlled to control etching rates of metals suitably to process the substrate-to-be-processed which is not subjected to wiring steps. Furthermore, a feed rate of nitrogen gas is controlled to control growth of an oxide film formed on the surfaces of the substrate-to-be-processed. Accordingly, whether metal wiring is present or absent, generation of particles and contamination can be prevented, and in forming a thin oxide film, evenness of the film thickness and improved film quality can be achieved.

What is claimed is:

1. A substrate processing method for processing at least a substrate-to-be-processed held in a processing vessel with a processing gas fed to the substrate, the method comprising:

a first step of feeding the processing gas into the processing vessel to pre-pressurize an atmosphere surrounding the substrate; and a second step of feeding a solvent vapor and the processing gas into the processing vessel pre-pressurized by the processing gas to process the substrate after the first step, wherein the processing gas is ozone gas and the solvent vapor is steam.

2. The substrate processing method according to claim 1, further comprising the step of:

adjusting a temperature of the substrate before the processing gas is fed into the processing vessel.

3. The substrate processing method according to claim 2, wherein in the step of adjusting a temperature of the substrate, a gas having an adjusted temperature is fed into the processing vessel.

4. The substrate processing method according to claim 1, wherein in the step of feeding ozone gas and steam to process the substrate, nitrogen gas is fed into the processing vessel while a feed amount of nitrogen gas is adjusted.

5. The substrate processing method according to claim 4, wherein the feed amount of nitrogen gas is controlled to be zero.

6. The substrate processing method according to claim 4, wherein the substrate is a semiconductor substrate having a metal wiring.

* * * * *